United States Patent [19]

Welbourn et al.

[11] Patent Number: 4,927,774
[45] Date of Patent: May 22, 1990

[54] SELF ALIGNED BIPOLAR FABRICATION PROCESS

[75] Inventors: Anthony Welbourn, Ipswich; Christopher Heslop, Woodbridge, both of England

[73] Assignee: British Telecommunications plc, London, England

[21] Appl. No.: 423,691

[22] Filed: Oct. 18, 1989

Related U.S. Application Data

[63] Continuation of Ser. No. 204,823, Jun. 10, 1988, abandoned.

[51] Int. Cl.⁵ .............................................. H01L 21/34
[52] U.S. Cl. ...................................... 437/31; 437/228; 437/241; 437/238; 148/DIG. 10; 148/DIG. 11; 148/DIG. 124; 357/34; 357/59
[58] Field of Search ..................... 437/31, 32, 33, 228, 437/225, 233, 238, 241; 357/34, 59 H; 156/643, 653, 657; 148/DIG. 10, DIG. 11, DIG. 124

[56] References Cited

U.S. PATENT DOCUMENTS

| | | | |
|---|---|---|---|
| 4,338,138 | 6/1982 | Cavaliere | 357/591 X |
| 4,392,149 | 7/1983 | Harng | 357/59 H |
| 4,455,738 | 6/1984 | Houston | . |
| 4,746,629 | 5/1988 | Hanasaski | 148/DIG. 11 |
| 4,782,030 | 11/1988 | Katsumata | 357/591 X |
| 4,801,556 | 1/1989 | Welbourn | 148/DIG. 10 |

FOREIGN PATENT DOCUMENTS

| | | | |
|---|---|---|---|
| 0125174 | 11/1984 | European Pat. Off. | . |
| 0168260 | 7/1986 | Japan | 437/31 |
| 0144358 | 6/1987 | Japan | 437/31 |
| 0215070 | 9/1988 | Japan | 437/31 |

OTHER PUBLICATIONS

International Electron Devices Meeting, 9-th–11th Dec. 1974, Technical Digest, Washington, D.C., pp. 279–282; H. Kamioka et al.: "A New Sub-Micron Emitter Formation with Reduced Base Resistance for Ultra High Speed Devices".

Patent Abstracts of Japan, vol. 7, No. 200 (E-196) [1345], 3rd Sep. 1983; & JP-A-58 98 942 (Hitachi Seisakusho K.K.).

IBM Technical Disclosure Bulletin, vol. 26, No. 8, Jan. 1984, pp. 4304–4307, New York, U.S.; F. S. Lai: "Self-Aligned Contact Process Using an Ion-Implanted Silicon Nitride Film as an Oxidation Mask".

Primary Examiner—Brian E. Hearn
Assistant Examiner—Kevin McAndrews
Attorney, Agent, or Firm—Nixon & Vanderhye

[57] ABSTRACT

A self-aligned process for the fabrication of a walled-emitter transistor includes the formation of an isolated device island on the surface of a semiconductor wafer. A layer of dielectric is then formed on the wafer, leaving only part of the device island exposed. A 'substitute emitter' of silicon nitride is then formed on the exposed part of the device island in the position which will subsequently be occupied by the emitter. The exposed surface of the device island is then oxidized, some oxide being formed beneath the periphery of the substitute emitter. Oxide spacers are then formed non-lithographically about the periphery of the substitute emitter, after which the substitute emitter is removed and a base is formed in the semiconductor thus exposed. An emitter is then formed in the exposed semiconductor.

12 Claims, 1 Drawing Sheet

1

SELF ALIGNED BIPOLAR FABRICATION PROCESS

This is a continuation of application Ser. No. 07/204,823, filed 10 June 1988, now abandoned.

BACKGROUND OF THE INVENTION

This invention relates to a walled-emitter bipolar transistor, and to a method of fabricating such a transistor.

Walled-emitter transistors, that is to say transistors in which sidewall contact between the base and the emitter is eliminated, offer the advantages of lower capacitance and greater speed than comparable 'conventional' transistors. As with other transistors, there is a strong incentive to reduce the size of such devices in order to further increase their operating speed. The consequent reductions in feature size make the use of a self-aligned fabrication process increasingly necessary, but heretofore there have been no simple self-aligned fabrication processes for the manufacture of walled-emitter transistors.

SUMMARY OF THE INVENTION

The present invention provides a method of fabricating a walled-emitter transistor, the method comprising the steps of:

(a) forming an isolated device island on the surface of a semiconductor wafer;

(b) forming a first layer of dielectric material on the surface of the semiconductor wafer, the first layer of dielectric material having an opening exposing at least part of the device island;

(c) forming a body of dielectric material within said opening to leave exposed an annulus of the device island;

(d) oxidising the surface of said exposed annulus to produce a layer of oxide which extends beneath the periphery of the body of dielectric material;

(e) forming non-lithographically, within said opening, an annular body of dielectric material against and about the body of dielectric material;

(f) forming a base contact conductor about the annular body of dielectric material and in contact with the semiconductor of the device island;

(g) forming a second layer of dielectric material on the base contact conductor;

(h) removing the body of dielectric material to expose the substrate within the inner periphery of the annular body of dielectric material, and forming a base region within the semiconductor so exposed; and (i) forming an emitter in the semiconductor exposed within the inner perhiphery of the annular body of dielectric material.

Advantageously, the first layer of dielectric material provides isolation for the device island, and is a thermally-grown oxide.

In a preferred embodiment, the body of dielectric material comprises a layer of silicon nitride having a thickness lying in the range of from 0.3 to 1.0 um, the dielectric material of the annular body comprises an oxide of silicon, and the base contact conductor comprises polysilicon. Preferably, the polysilicon base contact conductor is silicided. Advantageously, the polysilicon of the base contact conductor is oxidised to provide the second layer of dielectric material.

The emitter may be formed by diffusion of a dopant from a polysilicon emitter contact formed within the inner periphery of the annular body. Conveniently, the layer of oxide produced by oxidising the surface of said exposed annulus has a thickness, under the periphery of the body, of between 0.1 and 0.15 um.

Alternatively, the emitter is formed by diffusion or direct implantation, and has a depth of more than 0.1 um. In this case, the layer of oxide produced by oxidising the surface of said exposed annulus has a thickness, under the periphery of the body, of between 0.15 and 0.3 um.

BRIEF DESCRIPTION OF THE DRAWINGS

The invention also provides a transistor whenever made according to the method defined above, and an integrated circuit comprising a plurality of such transistors.

The invention will now be described in greater detail, by way of example, with reference to the accompanying drawings, in which.

DESCRIPTION OF PREFERRED EMBODIMENT

Figure 1:
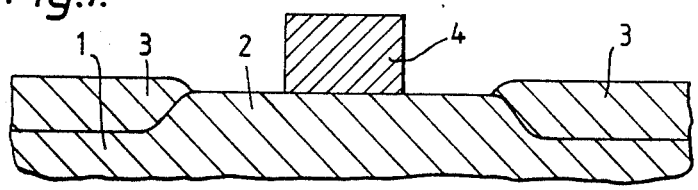
FIGS. 1 to 5 are cross-sectional views showing schematically various stages in the fabrication of a walled-emitter transistor.

Referring to the drawings, a semiconductor wafer 1, preferably of silicon, is conventionally processed to give (for npn devices) a buried layer (not shown), and an $n^+$ collector sinker and device isolation resulting in the formation of isolated device islands 2 (see FIG. 1). Junction isolation can be used, but preferably the isolation is provided by a dielectric such as oxide 3. Preferably, dielectric isolation is provided as the result of a process such as LOCOS (local oxidation of silicon) as shown in FIG. 1. If junction isolation is used, a layer of dielectric material, such as oxide, must be formed in place of the surface oxide 3 which is grown in the LOCOS process, and which covers the entire surface of the wafer 1 apart from the device islands 2.

When the wafer 1 has been processed to form the isolated device islands 2 surrounded by the surface dielectric 3, a "substitute emitter" 4, covering that part of the device island 2 in which the emitter will eventually be defined, is formed. In order that oxide spacers can subsequently be formed, the sides of the substitute emitter 4 should be substantially normal, preferably at an angle of between 80° and 90°, to the wafer surface. The substitute emitter 4, which is between about 0.5 um and 1 um thick, is preferably formed principally of silicon nitride over a thin layer of oxide. Alternatively, aluminum nitride could replace the silicon nitride. The nitride of the substitute emitter 4 may, where the LOCOS process has been used, utilise part of the nitride mask used in the LOCUS process, made up to a thickness of about 0.5 to 1.0 um. Alternatively, the LOCOS mask may be stripped completely, and the substitute emitter 4 made of entirely new nitride. Since thick nitride layers are prone to failure due to built-in stress, it may be found preferably to use oxide in place of nitride for the top 1000–2000A or so of the substitute emitter 4. The structure after formation of the substitute emitter 4 is shown in FIG. 1.

Figure 2:
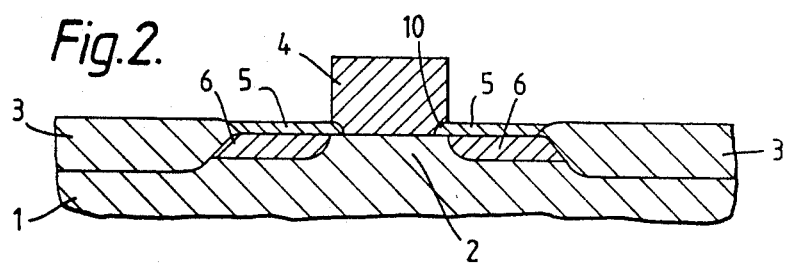

In cutting the substitute emitter 4, for which an anisotropic (plasma) etch is used, damage may be caused to the surface of the silicon which is exposed during etching. In order to ensure that the device's active region is free from the effects of such damage (traps formed in the semiconductor as a result of plasma etching lead to leakage currents due to recombination of electron-hole pairs), the silicon is oxidised to a depth of about 1000-2000A, thereby forming an oxide layer 5. During this oxidation step, the silicon under the edge of the substitute emitter 4 is oxidised to form the oxide 10 which will subsequently provide the sidewall surrounding the emitter. The amount of silicon consumed determines the sidewall height. A dopant, such as boron, is then implanted through the oxide layer 5 on the device island 2 to form extrinsic p+ regions 6 which will subsequently form the base contacts. The structure at this stage is shown in FIG. 2.

Figure 3:
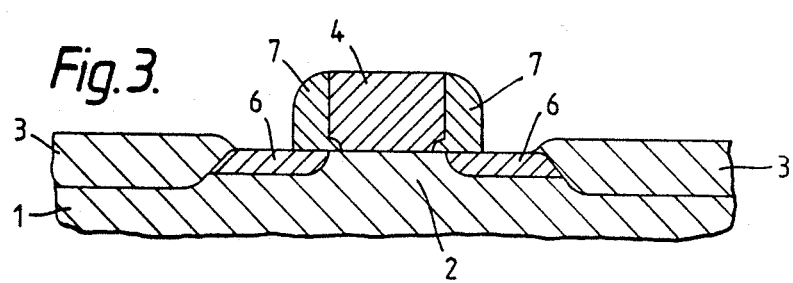

A thick (typically 0.3 to 0.5 um) oxide layer is deposited over the whole, and then anisotropically (plasma) etched without a mask to form spacers 7 on the sides of the substitute emitter 4. The thickness of oxide used will depend upon the height of the substitute emitter 4, on the width of the spacers 7 required, and on the slope of the sidewalls of the substitute emitter. During the anisotropic etch step, the n+ base contacts 6 are exposed, as shown in FIG. 3, and any oxide on the substitute emitter 4 is stripped.

Figure 4:
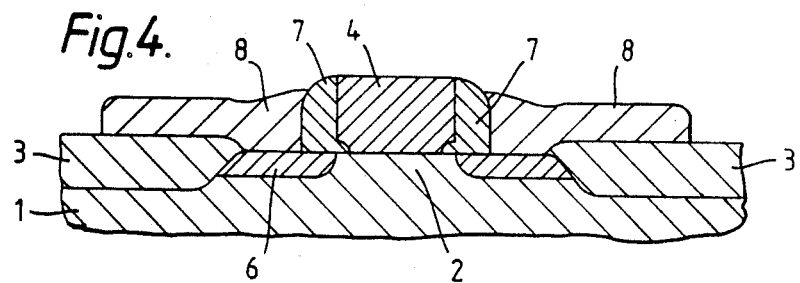

A base contact conductor 8 is then formed about the oxide spacers 7 in contact with the extrinsic base. The position of the base contact conductor 8 relative to the base and the emitter is determined by the width of the oxide spacers 7. Consequently, no patterning step is required to define the important dimensions of the conductor 8. Although the base contact conductor 8 may be metal, preferably it is polysilicon. More preferably, the polysilicon is silicided (to form polycide) to improve its conductance. The base contact conductor 8 is cut to expose the substitute emitter 4, as shown in FIG. 4. Preferably, the polysilicon is planarised by spinning on a planarising layer, such as photoresist, and then planar etched to expose the top of the substitute emitter 4. The polysilicon is then heavily doped p+. If the polysilicon is to be silicided, it is preferably done at this stage, as it means that high conductivity exists in the base contact conductor 8 right up to the edge of the oxide spacers 7. The extent of the base may then be defined using a conventional lithographic process.

A dielectric layer 9 is then formed over the base contact conductor 8. Where the conductor 8 is polysilicon or polycide, the dielectric is preferably formed by surface oxidation. Where the conductor 8 is metal, the dielectric, typically oxide, is deposited and then etched to expose the substitute emitter 4.

The substitute emitter 4 is then removed by etching to expose the silicon in the base region.

The base 11 is then doped (preferably by implantation) with p-type impurities, typically boron, through the opening left by removal of the substitute emitter 4. If a shallow (typically 500-1000A) emitter is to be used, a further polysilicon layer, doped with n-type impurities is then formed over the whole, and then cut to provide an emitter contact 13. A short anneal is performed, and the n-type dopant diffuses from the polysilicon emitter contact 13 into the single crystal silicon to form a shallow emitter 12. If an emitter 12 of more conventional depth (typically 0.25 um), such as may be formed by diffusion or direct implantation, is required, metal may replace the emitter polysilicon. With a deep emitter 12, greater sidewall depth is required, and this is provided by increasing the thickness of the thermal oxide grown under the edge of the substitute emitter 4. If a deep emitter 12 is to be used, it may be found preferable to cut away some of the silicon adjacent to the substitute emitter 4 prior to the thermal oxidation step, to reduce the required overall oxide thickness. Conveniently, such a reduction in silicon thickness is effected by continuing the etch step used to define the substitute emitter 4.

Figure 5:
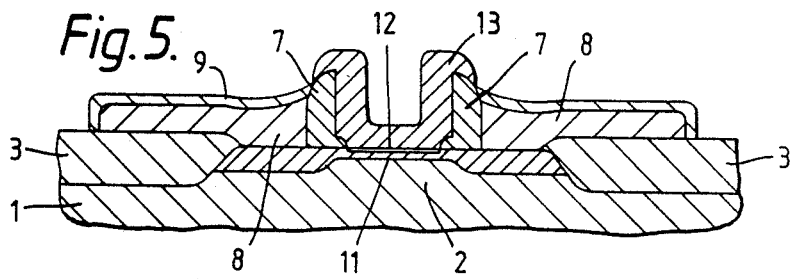

As can be seen from FIG. 5, the emitter 12 is surrounded by oxide and only its underside contacts the base 11.

Subsequent processing, including the deposition of a dielectric layer, and cutting contacts to the base, emitter polysilicon and the collector sinker, may be carried out conventionally.

With the present process it is, therefore, possible to obtain the benefits of a self-aligned process, while avoiding the questionable reliability of shallow diffused emitters and polysilicon emitter contacts—which is of considerable relevance to applications such as repeaters for submarine telecommunications cables where very high reliability is required. Moreover, the process steps of the present invention are compatible with CMOS fabrications steps, so the invention has applicability to BICMOS (that is to say joint fabrication of bipolar and CMOS devices).

I claim:
1. A method of fabricating a walled-emitter transistor, the method comprising the steps of:
    (a) forming an isolated device island (2) on the surface of a semiconductor wafer (1);
    (b) forming a first layer (3) of dielectric material on the surface of the semiconductor wafer (1), the first layer (3) of dielectric material having an opening exposing at least part of the device island (2);
    (c) forming a body (4) of dielectric material within said opening to leave exposed an annulus of the device island (2);
    (d) oxidising the surface of said exposed annulus to produce a layer (5) of oxide which extends beneath the periphery of the body (4) of dielectric material;
    (e) forming non-lithographically, within said opening, an annular body (7) of dielectric material against and about the body (4) of dielectric material;
    (f) forming a base contact conductor (8) about the annular body (7) of dielectric material and in contact with the semiconductor of the device island (2);
    (g) forming a second layer (9) of dielectric material on the base contact conductor (8);
    (h) removing the body (4) of dielectric material to expose the substrate within the inner periphery of the annular body (7) of dielectric material, and forming a base region (11) within the semiconductor so exposed; and
    (i) forming an emitter (12) in the semiconductor exposed within the inner periphery of the annular body (7) of dielectric material.

2. A method as claimed in claim 1, wherein the first layer (3) of dielectric material provides isolation for the device island (2).

3. A method as claimed in claim 2, wherein the first layer (3) of dielectric material comprises a thermally-grown oxide.

4. A method as claimed in claim 1, wherein the body (4) of dielectric material comprises a layer of silicon nitride having a thickness lying in the range of from 0.3 to 1.0 um.

5. A method as claimed in claim 1, wherein the dielectric material of the annular body (7) comprises an oxide of silicon.

6. A method as claimed in of claim 1, wherein the base contact conductor (8) comprises polysilicon.

7. A method as claimed in claim 6, wherein the polysilicon of the base contact conductor (8) is oxidised to provide the second layer (9) of dielectric material.

8. A method as claimed in claim 6, wherein the polysilicon base contact conductor (8) is silicided.

9. A method as claimed in claim 1, wherein the emitter (12) is formed by diffusion of a dopant from a polysilicon emitter contact (13) formed within the inner periphery of the annular body (7).

10. A method as claimed in claim 9, wherein the layer (5) of oxide produced by oxidising the surface of said exposed annulus has a thickness under the periphery of the body (4), of between 0.1 and 0.15 um.

11. A method as claimed in claim 1, wherein the emitter (12) is formed by diffusion or direct implantation, and has a depth of more than 0.1 um.

12. A method as claimed in claim 11, wherein the layer (5) of oxide produced by oxidising the surface of said exposed annulus has a thickness, under the periphery of the body (4), of between 0.15 and 0.3 um.

* * * * *